(12) United States Patent
Duenas et al.

(10) Patent No.: US 8,707,796 B2
(45) Date of Patent: Apr. 29, 2014

(54) SEMICONDUCTOR STRAIN GAUGE ARRAY

(76) Inventors: Terrisa Duenas, Ventura, CA (US); Shiv Joshi, Rancho Palos Verdes, CA (US); Cesar Del Solar, Alhambra, CA (US)

( * ) Notice: Subject to any disclaimer, the term of this patent is extended or adjusted under 35 U.S.C. 154(b) by 426 days.

(21) Appl. No.: 13/136,572

(22) Filed: Aug. 4, 2011

(65) Prior Publication Data

US 2012/0031192 A1   Feb. 9, 2012

Related U.S. Application Data

(60) Provisional application No. 61/400,974, filed on Aug. 4, 2010.

(51) Int. Cl.
*G01L 1/00* (2006.01)
*G01B 7/16* (2006.01)
*G01L 1/22* (2006.01)
*H01L 21/00* (2006.01)

(52) U.S. Cl.
USPC ............... 73/777; 73/862.046; 73/862.044; 73/862.045; 29/25.01

(58) Field of Classification Search
USPC ................................ 73/777, 780; 29/25.01
See application file for complete search history.

(56) References Cited

U.S. PATENT DOCUMENTS

2008/0022778 A1*   1/2008   Liu et al. .................... 73/726
2008/0089383 A1*   4/2008   Liu et al. .................... 374/44

* cited by examiner

*Primary Examiner* — Lisa Caputo
*Assistant Examiner* — Jonathan Dunlap
(74) *Attorney, Agent, or Firm* — John R Ross; John R Ross, III (57) ABSTRACT

A strain monitoring system including an array of semiconductor strain gauges. Each strain gauge in the array of strain gauges includes a lithographically fabricated 4-resistor bridge for providing a voltage potential corresponding to the strain in the bridge and thin film transistors to provide addressability to each 4-resistor bridge in the array. After completion of the array of strain gauges, in preferred embodiments the array of strain gauges are transferred to polyimide film which is in turn bonded to a surface region of the component to be tested for strains. Each bridge provides voltage signals corresponding to the strain to which the material under the bridge is being subjected. In preferred embodiments control and data acquisition function are separated from the semiconductor strain gage array. Preferred embodiments the system are utilized to monitor strains on components of aircraft, especially light weight robotic aircraft.

20 Claims, 9 Drawing Sheets

SEMICONDUCTOR STRAIN GAUGE ARRAY

CROSS REFERENCE TO RELATED APPLICATIONS

This application claims the benefit of Provisional Patent Application Ser. No. 61/400,974 filed Aug. 4, 2010.

FEDERALLY SPONSORED RESEARCH

The present invention was made in the course of performance of Contract No. W31P4Q-04-C-R388 with Defense Advanced Research Projects Agency and follow-on Contract No. W31P4Q-05-C-0308 with the United States Air Force. The United States Government has rights in the invention.

FIELD OF THE INVENTION

The present invention relates to strain gauges and in particular to semiconductor strain gauges.

BACKGROUND OF THE INVENTION

Strain Gauges

A strain gauge is a device used to measure the strain of an object. The most common type of strain gauge consists of an insulating flexible backing which supports a metallic foil pattern. The gauge is attached to the object by a suitable adhesive, such as cyanoacrylate. The piezoresistive effect describes the changing electrical resistance of a material due to applied mechanical stress. The piezoresistive effect of metal sensors is only due to the change of the sensor geometry resulting from applied mechanical stress. Semiconductor strain gauges have been available since the 1960's. The piezoresistive effect of semiconductor materials can be several orders of magnitudes larger than the geometrical piezoresistive effect in metals and is present in materials like polycrystalline silicon, amorphous silicon, silicon carbide, germanium and single crystal silicon.

The resistance of semiconductors such as silicon changes not only due to the stress dependent change of geometry, but also due to the stress dependent resistivity of the material. This results in gauge factors to orders of magnitudes larger than those observed in metals. As the object being tested is strained, the foil is deformed, causing its electrical resistance to change. This resistance change, often measured using a Wheatstone bridge, is related to the strain by the quantity known as the "gauge factor".

Gauge Factor

The gauge factor of a strain gauge GF is defined as:

$$GF = \frac{\frac{\Delta R}{R_G}}{\varepsilon}$$

where
$\Delta R$ is the change in resistance caused by strain,
$R_G$ is the resistance of the undeformed gauge, and
$\varepsilon$ is strain.

For metallic foil gauges, the gauge factor is usually a little over 2. Semiconductor strain gauges can have gauge factors in the range of 20 to 40. Semiconductor strain gauges are currently used in a wide range of products. Many commercial devices such as pressure sensors and acceleration sensors employ the piezoresistive effect in silicon.

Wheatstone Bridges

Figure 10:
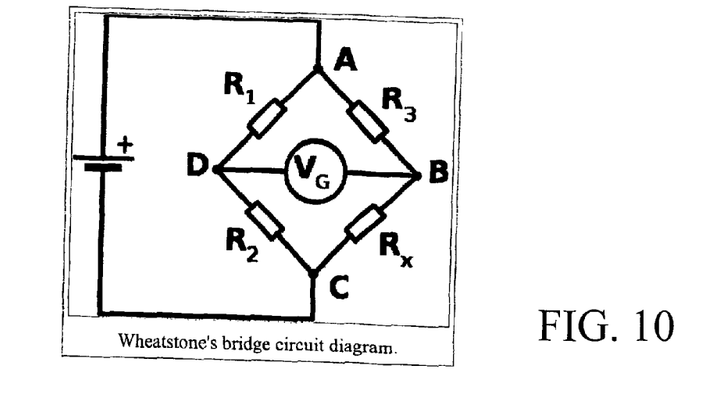
FIG. 10 is a drawing of a Wheatstone bridge circuit.

A Wheatstone bridge is a device for measuring electrical resistance. FIG. 10 is a sketch of a typical Wheatstone bridge circuit $R_1$ and $R_2$ have known resistance, $R_2$ is an adjustable resistor and $R_x$ is an unknown resistance. $V_G$ is zero if $R_2/R_1 = R_x/R_3$. By adjusting the resistance of $R_2$ the resistance of $R_x$ can be measured very accurately.

Fabrication

Piezoristors can be fabricated using wide variety of piezoresistive materials. The simplest form of piezoresistive silicon sensors are diffuse resistors. Piezoresistors consist of a simple two contact diffused n-well or p-wells within a p-well or n-substrate. As the typical square resistances of these devices are in the range of several hundred ohms, additional p+ or n+ plus diffusions are necessary to facilitate ohmic contacts to the device.

Prior Art Semiconductor Strain Patents

Semiconductor strain gauges have been available for many years providing gauge factors several ten's of times as high as that for metal strain gauges. Examples are described in the following patents: U.S. Pat. Nos. 3,084,300; 3,312,790; 3,719,913; 3,673,354; 3,705,993; 3,805,601; 3,922,705; 3,940,730; 4,047,144; 4,151,502; 4,173,148; 4,203,327; 4,234,361; 4,292,618; 4,422,063; 4,480,478; 4,911,016; 5,587,531; 6,653,702; and 7,666,699. The teachings of all of these prior art semiconductor strain gauges are incorporated herein by reference.

Aircraft Design and Testing

Due to the various loads that aircraft must tolerate, structural integrity becomes a major factor in aircraft design. Extensive testing and investigation of structural stress must be performed before an aircraft can be built for flight. Non-flying "load models" are often built just to investigate loading and structural stresses. These stresses will produce strain in the aircraft components. Strain can be directly measured only where there exist a strain gauge. Often the designers and test engineers do not know for certain exactly where strain gauges should be positioned. Conventional strain gauges require two wires to address each strain gauge. For a typical situation where an aircraft wing is being tested, hundreds of separate strain gauges may be required to provide a complete description of the strains to which the wing is being subjected.

What is needed are better systems and techniques for testing for strain especially in aircraft components.

SUMMARY OF THE INVENTION

The present invention provides a strain monitoring system including an array of semiconductor strain gauges. The array of strain gauges are preferably produced by lithographic processes on a silicon on insulator (SIO) handle wafer. In preferred embodiments each strain gauge in the array of strain gauges includes a 4-resistor bridge for providing a voltage potential corresponding to the strain in the bridge and thin film transistors to provide addressability to each resistor bridge in the array. The array of strain gauges is lithographically created in and on the silicon layer. After completion of a high-temperature portion of the lithographic process, the array is released from the handle wafer and is bonded to a polyimide film substrate. A metallization layer is then applied in which the metal conductors are created to provide row bias and column readout access to each strain gauge. After completion of the array of strain gauges, the polyimide film is bonded to a surface region of a component being tested for strains. Each bridge provides voltage signals corresponding to the strain to which the material under the bridge is being subjected. In preferred embodiments control and data acquisition function are separated from the semiconductor strain gage array. Preferred embodiments the system are utilized to monitor strains on components of aircraft, especially light weight robotic aircraft.

Preferred embodiments include arrays of strain gauges in which row-column select single sensors are co-fabricated with the strain sensors. This multiplexing technique permits automation of the single selection of sensors distinguished by their location in a row along with their location in a column. Selection is accomplished by switching that sensor on which facilitates a voltage drop and current flow to that sensor thereby enabling it to function.

DETAILED DESCRIPTION OF PREFERRED EMBODIMENTS

Four Resister Bridge Circuits

Figure 11:
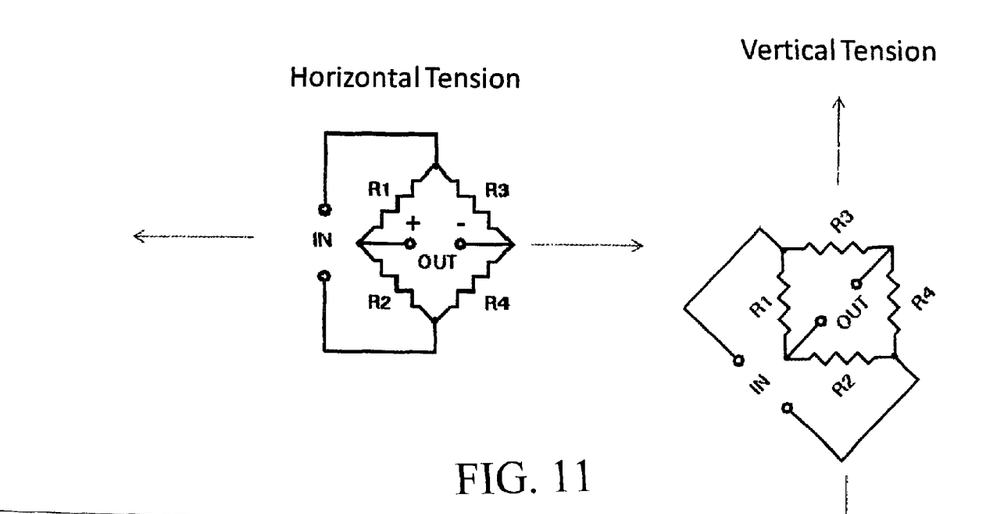
FIG. 11 shows a preferred 4-resistor bridge circuits designed to measure horizontal and vertical tension.

In preferred embodiments each strain gauge in the array of strain gauges includes a 4-resistor bridge for providing a voltage potential corresponding to the strain in the bridge and thin film transistors to provide addressability to each resistor bridge in the array. The advantage to using the 4-resistor bridge circuit is in the increased 4-element sensitivity as opposed to single element (or leg) sensitivity common with Wheatstone bridge sensor circuits. Also, since there are two elements in the direction of matching resistors are not required for each otherwise single-sensor in order to complete a bridge. FIG. 11 depicts the operation of the strain sensor circuit.

As is the case with Wheatstone bridge circuits, an excitation voltage is applied to the IN contacts while the other two orthogonal OUT contacts are used to measure the differential output. The bridge is balanced when R1/R2=R3/R4 and any imbalance such as due to straining any of the resistors will cause the voltage across OUT to be nonzero. For a given bias voltage, an output voltage can be determined using Wheatstone bridge equations. For example, elongation of R3 and R2 causes their resistances to increase. The bridge becomes unbalanced and causes a positive output to be read. Compression causes a negative output to be read. Conversely elongation of R1 and R4 causes their resistances to increase. The bridge becomes unbalanced causing a negative output to be read. Compression causes a positive output to be read.

Fabrication of First Preferred Embodiment

Figure 1:
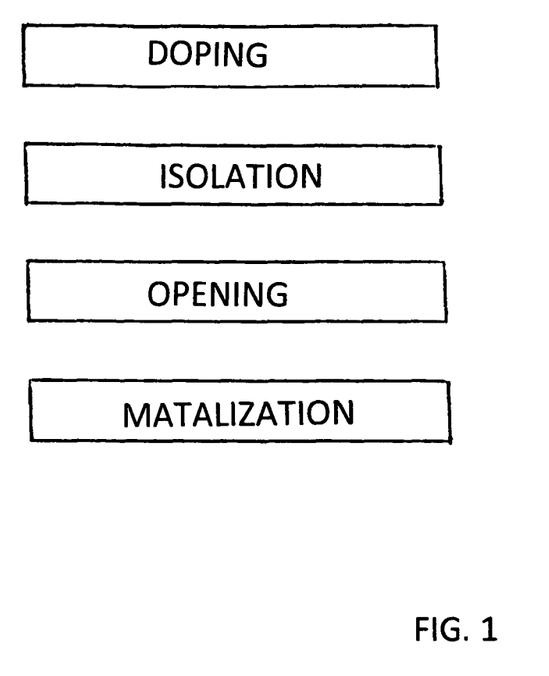
FIG. 1 is a drawing showing fabrication steps in the fabrication of preferred embodiments of the present invention.

FIG. 1 shows some of the principal sets of steps in a preferred process of fabrication of a 16×16 array of strain gauges lithographically fabricated in micro-crystalline silicon and bonded to a flexible Kapton substrate. These principal sets of steps include 1) masking steps, 2) isolation steps, 3) opening steps and 4) metallization steps.

Doping

Figure 2:
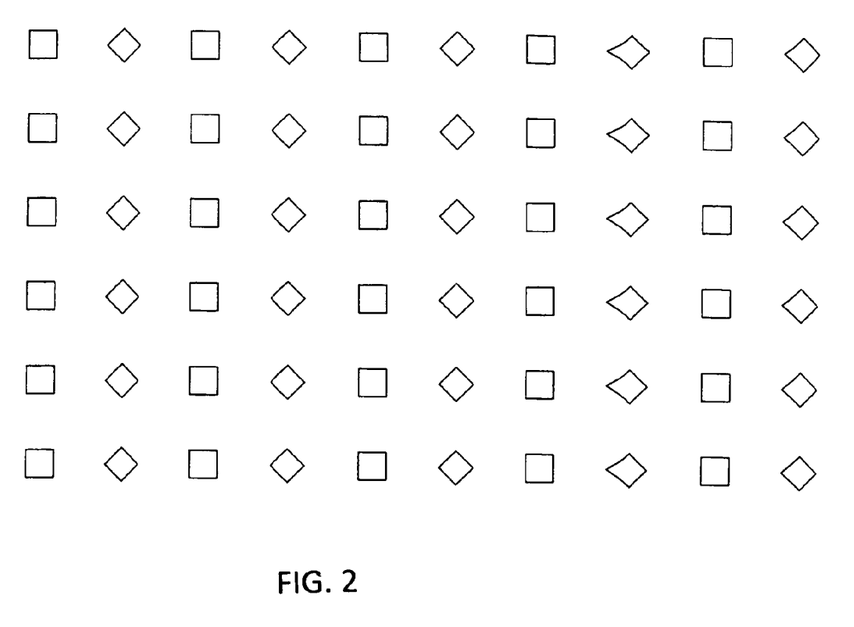
FIG. 2 shows a mask used for boron p-type doping.

The fabrication process starts with a silicon-on-insulator (SOI) wafer supplied by SOITEC. The SOI wafer has a top silicon thickness of 290 nm to 310 nm with the buried-oxide (Box) layer of 1 micron. As indicated in FIG. 1 the first fabrication step is a high temperature doping process. A plasma-enhanced chemical vapor deposition system from Plasma-Therm is used to deposit 30 nm of $SiO_2$ and 300 nm of SiN at 260° C. The $SiO_2$ and SiN layers serve as a diffusion barrier during high temperature boron doping. Spin-On-Dopant (SOD) of boron is used as a doping source. First, the $SiO_2$/SiN layer is photo-lithographically patterned and etched using buffered-oxide etchant to expose areas for boron doping using a mask pattern as shown in FIG. 2. The doped patterns shown as squares (one half of them rotated 45 degrees) will each become the four bridge leg-portions of the array of strain sensors.

After patterning the $SiO_2$/SiN layer, the wafer is immersed in Piranha solution ($H_2SO_4$:$H_2O_2$=1:1) for 10 minutes at 70° in order to remove any organic residue and to make the exposed silicon surface hydrophilic. After the Piranha soak, the wafer is dried and boron SOD is spin coated at 5000 rpm and is baked at 150° for 30 seconds in a $N_2$:$O_2$=8:2 environment. During the annealing step, boron impurities from the SOD layer are diffused into the silicon waver. After removing the SOD layer in HF, the wafer is annealed in 1100° C. for three hours in order to distribute the boron more uniformly in the silicon.

Figure 3:
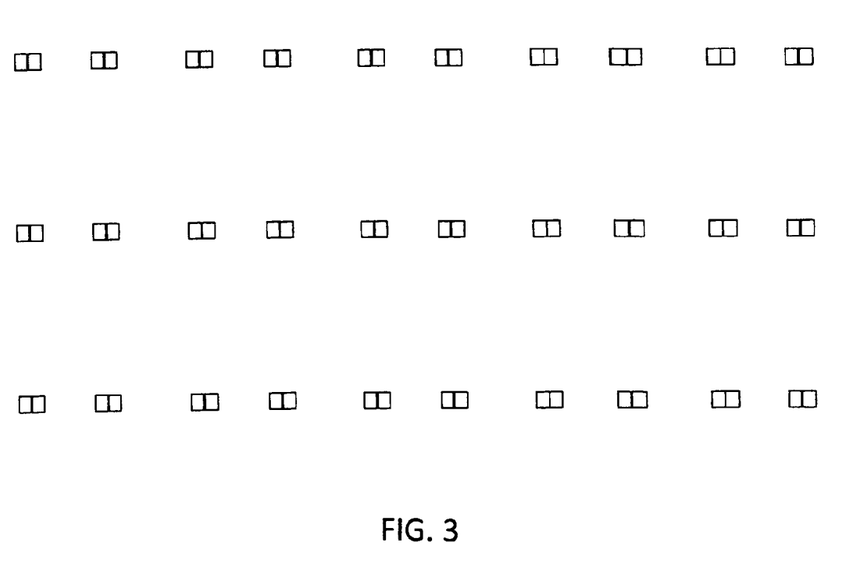
FIG. 3 shows a mask used for phosphorous n-type doping to produce thin film transistors.

A phosphorous doping process follows the same procedures as the boron doping procedure as described above with the exception of the annealing temperature. For phosphorous doping, dopant diffusion is carried out at 950° C. for 10 seconds in a rapid thermal annealing (RTA) process. The phosphorous-doped regions as indicated in FIG. 3 delineate the source and drain of the thin film transistors (TFTs) in the sensor array.

After the high temperature processes are completed, silicon membranes are photo-lithographically defined and immersed in 49% HF to etch the buried oxide layer underneath so as to release the microcrystalline silicon from the handle wafer. After the undercut is completed, an elastomeric stamp (preferably polydimethylsiloxane, PDMS) is laminated onto the silicon membrane conformably. The elastomeric stamp is used as a carrier to transfer the silicon membranes onto a polyimide substrate, preferably Kapton. Polyamic acid from Aldrich is used as an adhesive layer between the silicon membrane and the Kapton substrate. After curing the polyamic acid at 250° C. for 90 minutes, it turns into polyimide film which is essentially identical to the substrate, Kapton.

Figure 4:
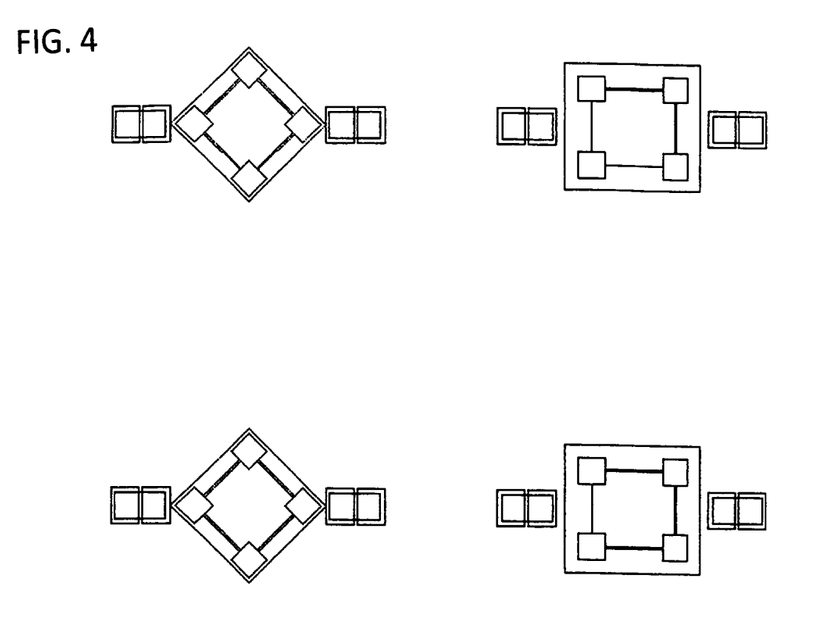
FIG. 4 shows a mask used for providing isolation.

In FIG. 4 the center large square box patterns (two are at angle to the other two) represent a boron doping mask. (There are 4 patterns, of two different types.) The collection of two side boxes on both sides of these larger boxes represent a phosphorus doping mask. The remaining features inside these boxes represent cell isolation patterns.

Isolation

The isolation process follows after the transfer in order to define the sensor and thin film transistor structures, and effectively isolate the 4-leg bridge sensor from the TFTs and the sensor cells from each other. All four legs of the bridge sensor have leg width of 5 micron and leg length of 200 micron. Next 100 nm of $SiO_2$, which serves as the gate oxides, is deposited by plasma enhanced chemical vapor deposition (PECVD).

Opening

Figure 5:
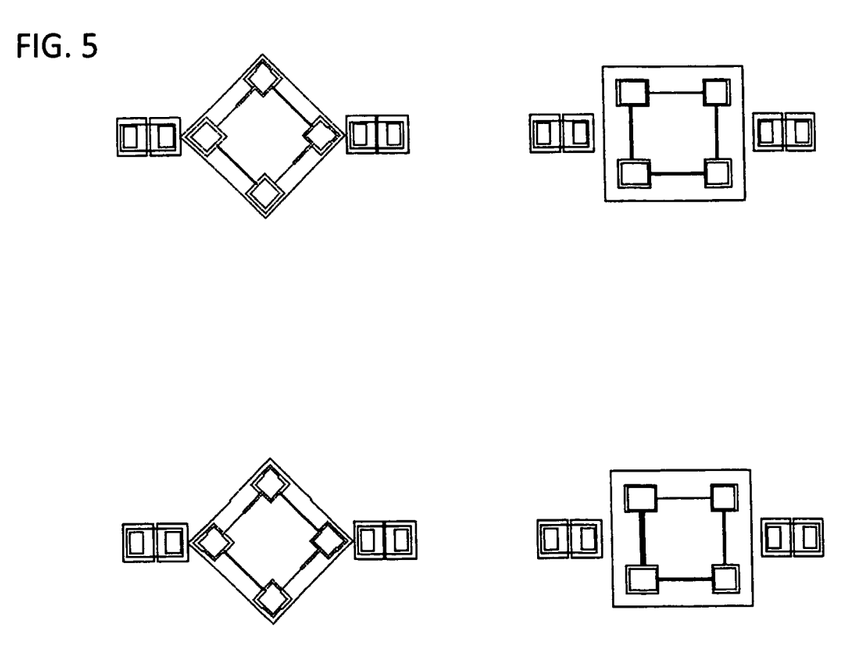
FIG. 5 shows a mask used for providing contact openings.

Source, drain, and sensor contact openings are made by etching the $SiO_2$ layer. The additional patterns in FIG. 5 when compared to FIG. 4 represent these openings regions for contacts. These additional patterns consist of little boxes within four large boxes in the corners of the 4-leg bridge patterns; and one each inside the collection of two side boxes on each side of the large boxes. (For each pattern, there are 8 additional boxes.)

Metallization

Figure 6:
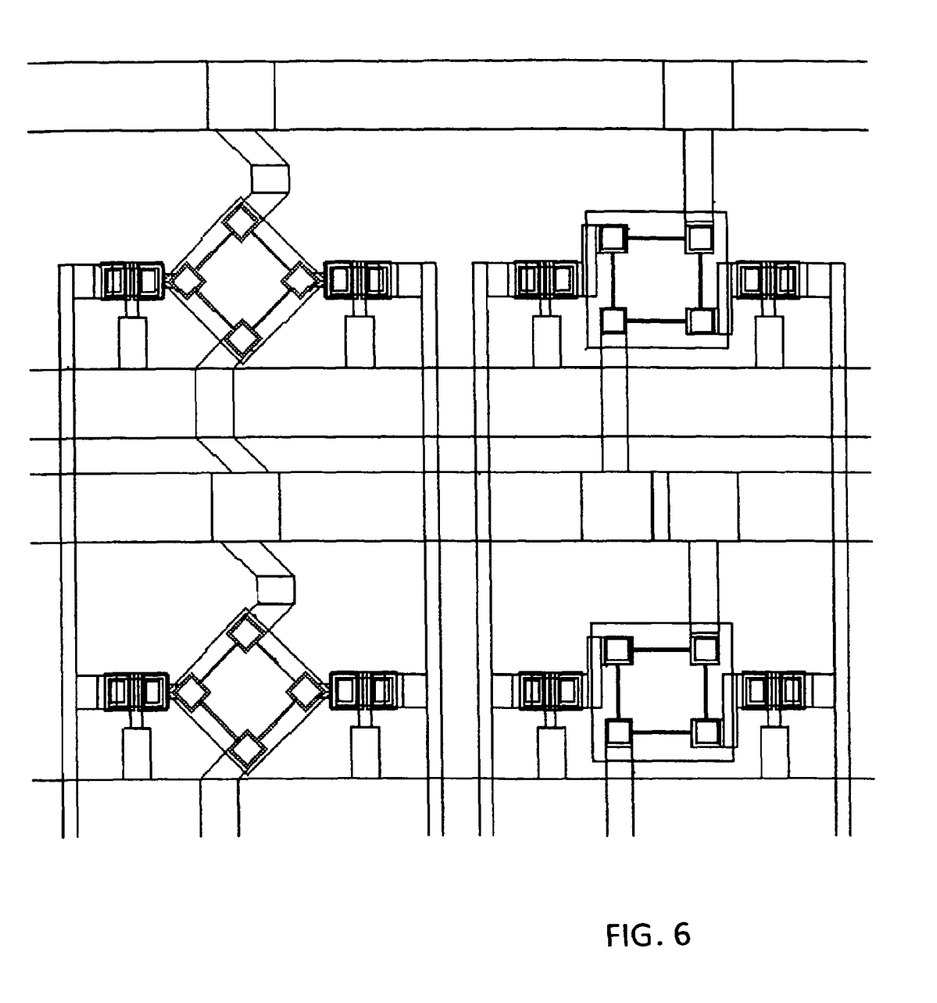
FIG. 6 shows a mask used for providing a metallization layer.

Finally the metallization layers are added. Each layer consists of 3 nm of chromium as an adhesive layer followed by 100 nm of gold, deposited with and E-beam evaporator. Both layers are shown together in the additional features shown in FIG. 6. In-between the metallization layers, photo-definable polymers such as SU-8 or BCB are used as an interlayer dielectric (ILD) to prevent electrical shorting between layers.

Figure 7:
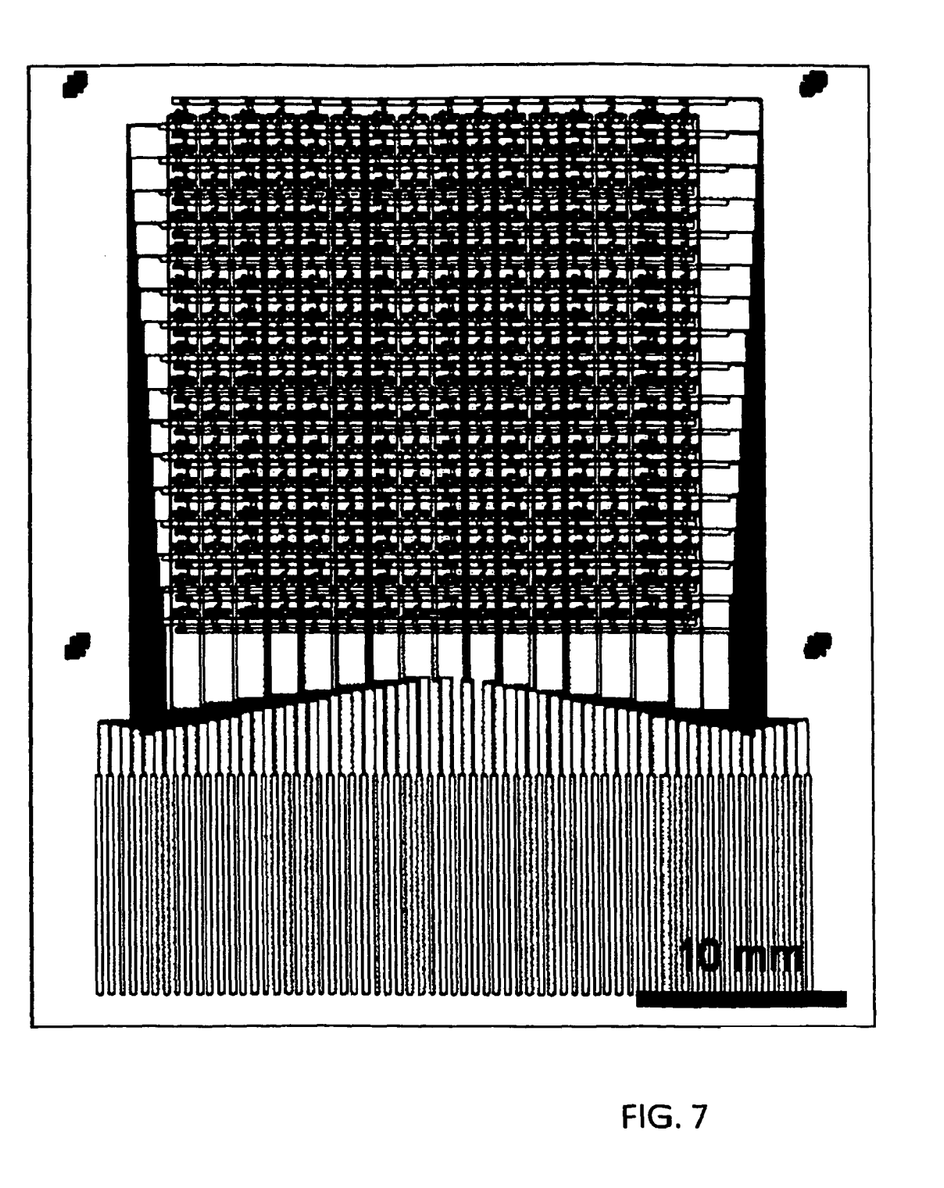
FIG. 7 shows an optical microscopic image of a 16×16 strain gage sensor.
Figure 8:
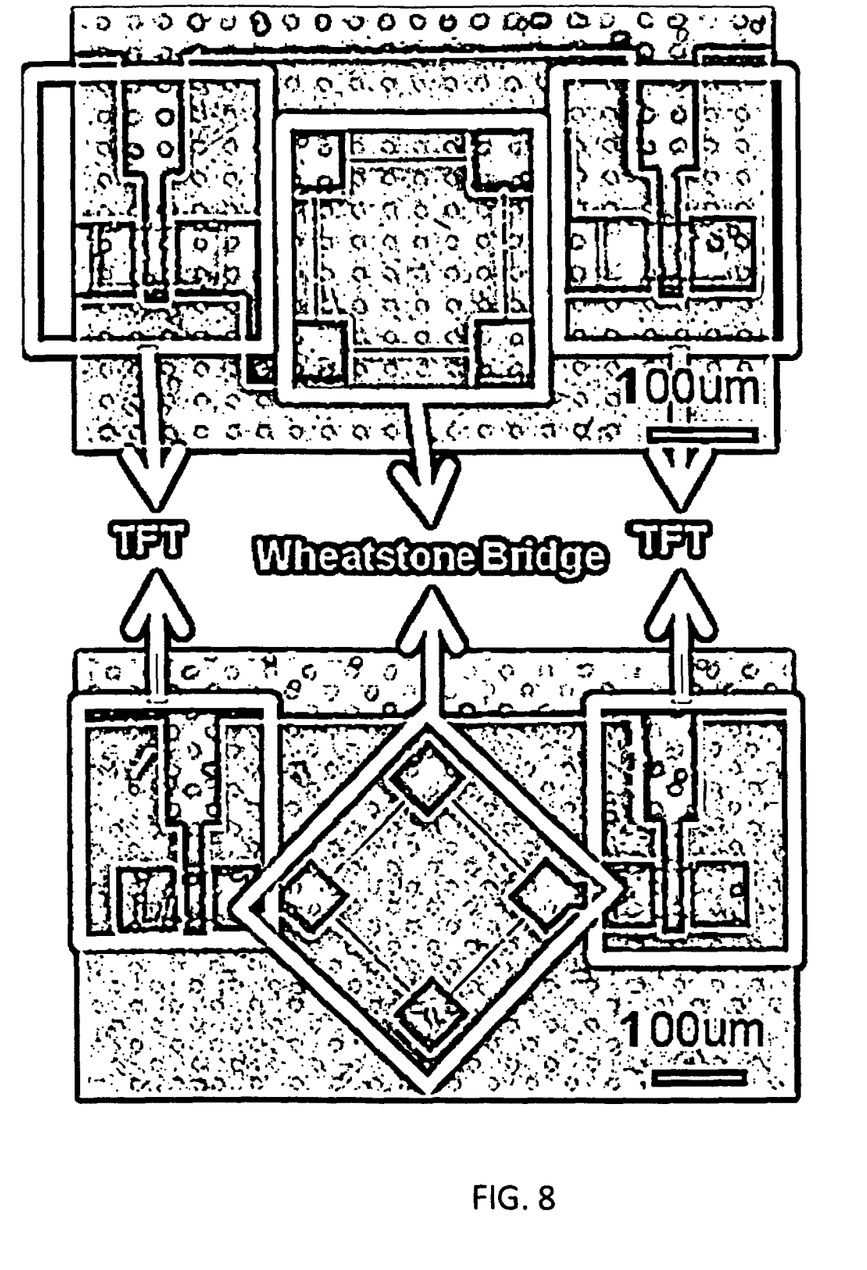
FIG. 8 shows microscopic optical images of individual sensor cells.

FIG. 7 is an optical microscope image illustrating the mask layout of the 16×16 strain gauge sensor array with integrated TFTs up to the first metallization layer. FIG. 8 is an optical image of preferred sensor cell with the TFT's and the 4-leg bridges identified with hand sketches. Both types of strain gauges are shown.

Data Acquisition

Figure 9:
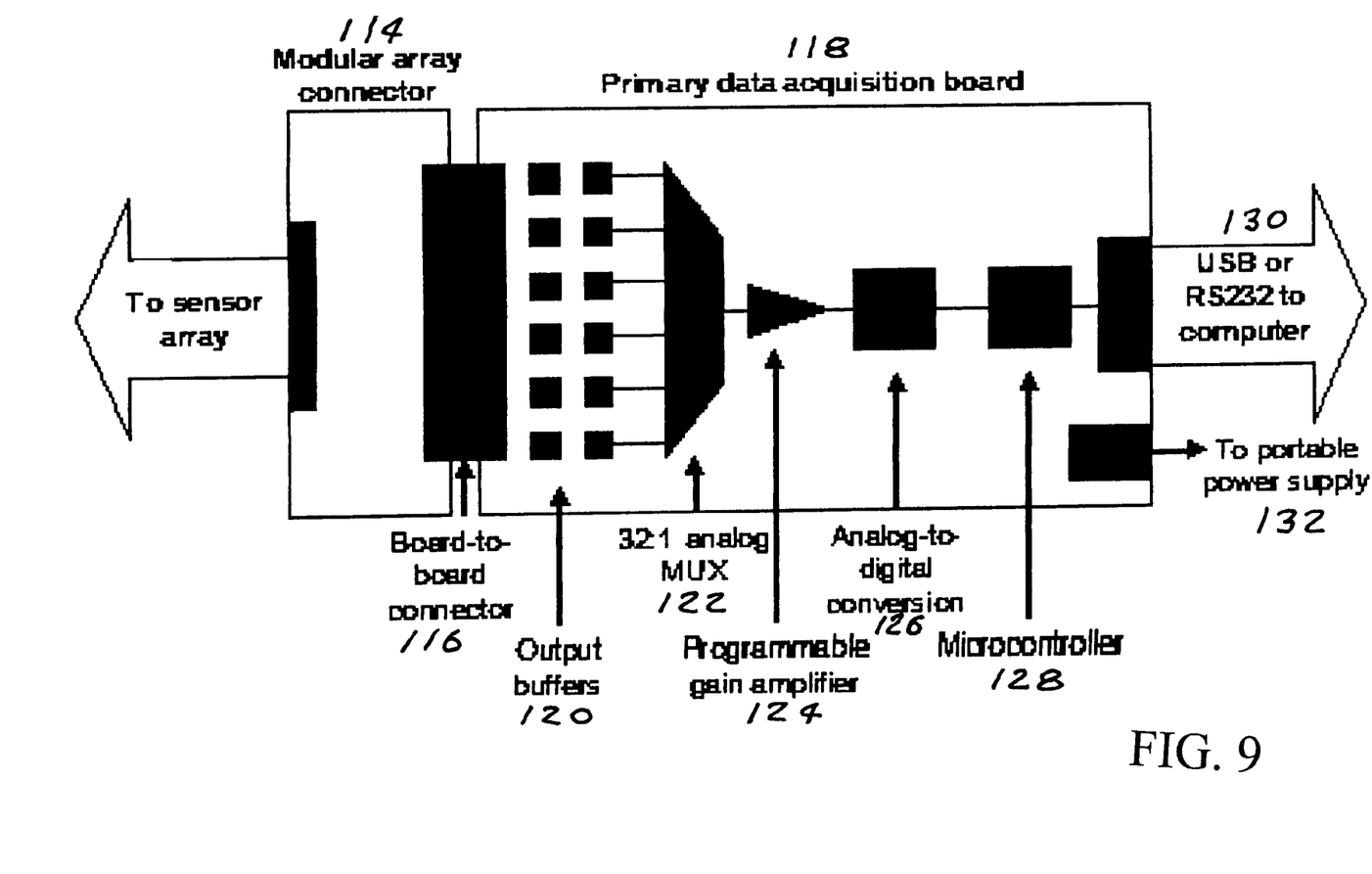
FIG. 9 is a block diagram describing a preferred sensor interrogation system.

FIG. 9 is a drawing showing components of a prototype data acquisition system. Modular array connector board 114 interfaces with the strain gauge sensors. Board-to-board connector 116 connects the modular array connector board 114 to a primary data acquisition board 118. Data acquisition board 118 includes output buffers 120, a 32:1 analog MUX 122, a programmable gain amplifier 124 an analog-to-digital conversion unit 126 and a microcontroller 128. A USB or RS232 connector 130 connects the data acquisition board to a control computer. The board 118 also includes a connection 132 to a power supply. The reader should note in this preferred embodiment the control and data acquisition features of the invention are separated from the sensor array. This is a good feature of the present invention because it permits the utilization of the sensor array in a wide variety of applications whereas the control and data acquisition functions can be tailored to specific needs, permitting the same sensor array design to be used in many varied applications.

Performance

Compared to Metal Strain Gauges

The 16×16 strain gage array provides many performance advantages over prior art metal foil strain gages. Table I displays some of these advantages. For example this embodiment provides gain factors up to about 100 as compared to about 2.0 to 4.5 for metal strain gauges. The array can be processor controlled to produce strain data feedback in just about any form desired. Individual strain gages can be addressed as desired or the entire 16×16 array can be readout in a time period of less than 10 milliseconds (A 32×32 array could be read out in less than 30 milliseconds.). The array can be attached to almost any surface with Super Glue (cyanoacrylate). Costs should be competitive with metal stain gauges.

Compared to Prior Art Semiconductor Strain Gauges

Improvements over prior art semiconductor stain gauges include the array arrangement of the stain gauges and the addition of the semiconductor switches for each strain gauge in the array permitting easy individual addressability as well as serial addressability for the whole array. The array contains two types of strain gauges, one with a 45-angle planar orientation to the other; these two orientations together provide a complete in-plane strain reading. The strain sensors work in concert to provide a strain profile that is independent of user alignment or misalignment of individual strain sensors. The strain gauge array including the multiplexing devices is in the form of a thin film, less than 2 microns, which facilitates conformal attachment to minimally curved surfaces and minimal impact on thickness increases. The thin-film flexible multiplexed form of the strain sensors facilitates ease of application onto large surface areas; previously, individual strain sensors would have to be applied separately with separate wiring for each strain gauge. Pre-alignment of the sensors on the sensor substrate and subsequent algorithmic treatment of data minimizes human interpretation of the data.

TABLE I

Performance of PEPSI Phase II Add-On Strain Sensors

| PARAMETER | METAL FOIL STRAIN GAGE | PEPSI Phase II add-on SEMICONDUCTOR STRAIN GAGE |
|---|---|---|
| Measurement range | 0.1 to 40,000 με | 0.001 to 8000 με predicted |
| Gage factor | 2.0 to 4.5 | Up to 100 |
| Resistance [Ω] | 120, 350, 600, . . . , 5000 | 1k to 500k |
| Size [mm] | 0.4 to 150 | 1 to 5 |
|  | Standard: 3 to 6 | 0.5 to 5 (phase II) |
| Gage length [mm] | 0.8 to 12.5 | 1 to 9 |
| Thickness | <1μ | <1μ |

TABLE I-continued

Performance of PEPSI Phase II Add-On Strain Sensors

| PARAMETER | METAL FOIL STRAIN GAGE | PEPSI Phase II add-on SEMICONDUCTOR STRAIN GAGE |
|---|---|---|
| Fatigue life | $10^5$ to $10^8$ | Longer fatigue life expected than metal strain gages. 126,000 cycles tested so far. |
| Temperature range [° C.] | −269 to 290 | May be temperature sensitive, but response must be tested. |
| Dynamic performance | Microseconds | Order 100 microseconds |
| Environmental sensitivity | Minimal | In high tension applications these sensors can be severely affected by temperature, steam, corrosive gases, chemicals and many other common contaminants. These sensors can be passivated |
| Properties match-i.e., modulus, thermal conductivity, thermal expansion | Limited to metals | Limited to metals and semiconductors |
| Infrastructure requirements | Standard | Environmental sensitivity requires sensor protection |
| Power requirements | 0.5-10 volts | 0.5-10 volts |
| Technical readiness level | 9 - commercially available product Vishay Micromeasurements | 9 - commercially available product (e.g., Micron Instruments, MicroStrain) |
| Array availability | N/A | These strain sensors can be fabricated in both discrete (single sensor) and array format |

Other Multiplexers

Figure 12:
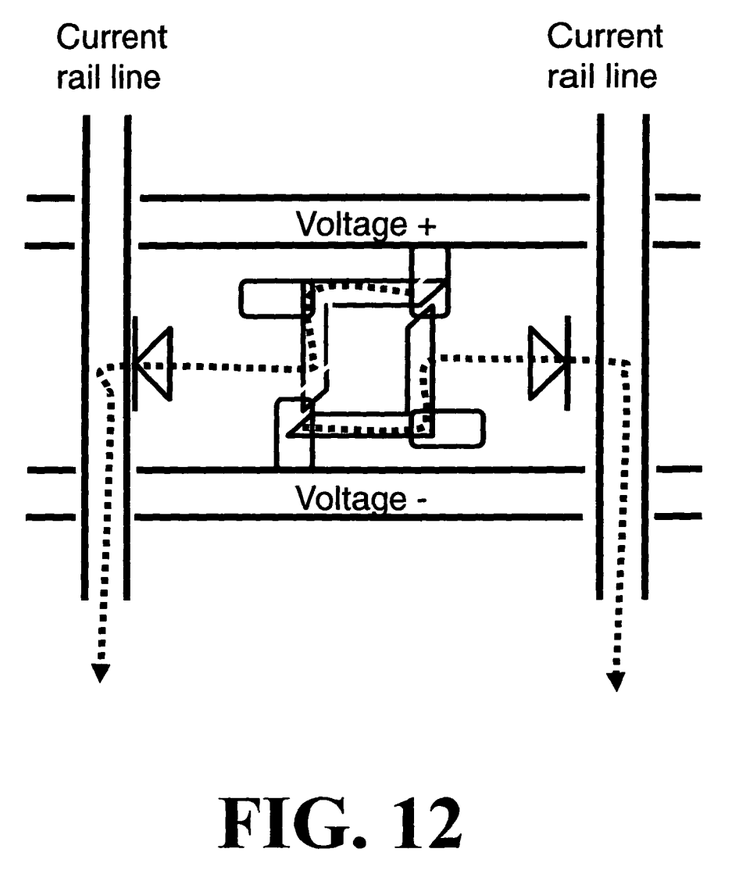
FIG. 12 shows details of an embodiment utilizing diode-based multiplexer instead of the thin film transistors.

The thin film transistors shown in FIGS. 3 and 4 can be replaced by other multiplexers such as diodes. FIG. 12 shows such modification. One advantage of the diodes over thin film transistors is in their response to a defective 4-leg bridge. A defective bridge in the thin film transistors may affect an entire column's output whereas a defective bridge in a diode only effects a single strain sensor. Furthermore, diodes are insensitive to strain where thin film transistors possess gate-source voltages that change as strain is applied. This is important as gate-source voltages determine the on and off state of the thin film transistor. The disadvantage is that the frequency response is about 40 ms to the change of input bias whereas the frequency response of the thin film transistor is only about 1 ms to the change in input bias.

Preferred Application

A preferred application of the present invention is for testing of aircraft components, especially aircraft wings and in particular the wings of light weight robotic aircraft. The present invention provides a means of measuring the structural state of an aircraft wing based on the strain sensed in the skin of the wing. The preferred 16×16 sensor array provides strain data at spatial intervals of 360 microns. Integration includes packaging of the sensors, signal processing, algorithmic treatment of data and interface with the operator/pilot/maintainer. In preferred embodiments differential amplifiers can be used to mitigate the risk of these long interconnect features potentially giving rise to unwanted antenna affects.

Sensor array substrates are preferably applied to the wing surfaces using the flexible conformable substrate. The sensors are packaged (i.e., protected, embedded and connected to downstream devices and interoperated with data processing software), embedded and integrated with a user interface. This user interface is a human (operator, pilot or maintainer) or a control CPU which then interfaces with the flight controls.

Due to the various loads that relatively lightweight aircraft must tolerate, structural integrity becomes a major factor in aircraft design. Extensive testing and investigation of structural stress must be performed before an aircraft can be built for flight. In fact, many aircraft will see a non-flying "load model" built solely for the purpose of investigating loading and structural stresses. These stresses will produce deflections and deformations in a material known as strain. It is this strain that is of interest to airplane maintainers and operators. This strain can be collected and presented to the user in an easy to use graphical user interface (GUI). Furthermore, algorithmic processing can be performed on the data to verify sensor integrity and to provide mapping information (shape) about the strain being measured. The airplane designer is interested in the strain, deflection, deformation and shape change of the aircraft during load testing and design. The airplane operator is interested in the same information when the aircraft is experiencing or has experienced hard landings, gust loads, or any performance beyond the load limits intended for the aircraft. Mounting or embedding these sensors on load-models will help reduce the development time by providing the designer with complex mapped strain information based on different load profiles. The airplane maintainer will benefit from the same information collected from an aircraft that has flown a mission outside of its intended structural performance envelope.

These strain sensors are superior to conventional metal foil strain gage in their greatly increased gage factor. The array design of the present invention is also a major improvement over prior art semiconductor strain gauges. The large arrays are fabricated with lithographic techniques provides low-cost sensor with 360 microns spacing. The array design also mitigates wire ingress/egress issues. Adding the TFT switches to each 4-leg bridge permits a fabrication approach that separates the sensor layer and the control network layers and represents important advantages over typical prior art designs.

Structural state sensing provides the pilot or autonomous flight control system situational awareness of the aircraft's performance and structural compromise. In the case of strain sensors, structural state sensing data can be used to collect flight performance data for airworthiness certification data or "on-the-fly" self-certification. Structural state sensing can also be used to feedback into the flight controls for safety, performance, or drag reduction in cruise flight maneuvering. The invention may be utilized initially by the military and their aircraft primes. However, any vehicular structure civil or aviation would benefit.

Antenna Deformation Correction

The advancement of structurally conformal antenna technologies has precipitated the need for compensating beam patterns during structural deformation of the host structure. In a preferred embodiment deformation compensation is provided on a large phased-array antenna system to enable correction for surface deformations occurring on the antenna which would otherwise compromise performance. The strain sensor arrays provide area information instead of single-point strain which will enable more accurate and comprehensive strain information. Data from the array permits the drawing of a shape map of the area covered by the array.

Variations

While the present invention has been described in terms of preferred embodiments, persons skilled in the art will recognize that many variations are possible within the general scope of the invention. For example, details of fine shapes and their movements are of interest to robot or prosthetic developers who will want to know the resulting movement of a limb or outer surface's structure based on actuator inputs to those components. The field of ergonomics may benefit from this invention. Because a map of deformation is provided, there are profiles of deformation that would be of interest to applications involving the identification of area impressions, where for example, deformation of a deformable surface populated with these strain sensor arrays and associated data-reduction algorithms could aid the user in determining what depressed the deformable surface—for example, if a finger or hand was applied, or if the deforming object was a particular geometric shape. Inflatable structures would also benefit from this invention where if feedback were added, the final shape could be known or iterated for.

Therefore the scope of the present invention should be determined by the appended claims and not limited be the specific embodiment described above.

We claim:

1. A strain monitoring system comprising:
   A) an array of lithographically fabricated semiconductor strain gauges, each strain gage in the array comprising:
      i) a 4-resistor bridge adapted to provide an electrical signal corresponding to the strain in the bridge,
      ii) at least two multiplexers adapted to provide addressability to the 4-resistor bridge,
   B) a control system and a data acquisition system physically separated from the array of semiconductor stain gauges.

2. The system as in claim 1 wherein the at least two multiplexers are at least two thin film transistors.

3. The system as in claim 1 wherein the array of strain gauges are fabricated in micro-crystalline silicon.

4. The system as in claim 3 wherein the array is bonded to a flexible substrate.

5. The system as in claim 4 wherein the substrate is a polyimide substrate.

6. The system as in claim 1 wherein the system is adapted for measuring the structural state of an aircraft part based on strain measurements of portions of the part.

7. The system as in claim 1 wherein the system is adapted for providing strain measurements or a surface to provide input information for deformation correction.

8. The system as in claim 7 wherein the surface is the surface of an antenna.

9. The system as in claim 1 wherein the system is adapted to measure movements of prosthetics.

10. The system as in claim 1 wherein the system is adapted to measure movements of parts of robotic equipment.

11. A process for lithographically fabricating a strain monitoring system comprising an array of semiconductor strain cells, said process comprising:
    A) a step of lithographically fabricating an array of strain gages on a silicon on insulator wafer having a buried oxide layer, each strain gage in the array comprising:
       i) a 4-resistor bridge adapted to provide an electrical signal corresponding to the strain in the bridge,
       ii) at least two multiplexers adapted to provide addressability to the 4-resistor bridge,
    utilizing the following steps:
       i) a set of doping steps comprising doping portions of the wafer with a p-type dopant and an n-type dopant, utilizing masks to create 4-leg bridges and thin film transistors in the substrate,
       ii) a set of isolation steps comprising the deposition of an insulating oxide layer over the p and n doped substrate to isolate the 4-leg bridges from the multiplexers and the sensor cells from each other,
       iii) one of more opening steps comprising etching the insulating oxide layer with masks to produce openings for electrical contacts,
       iv) a set of metallization steps comprising the utilization of masks with the deposition of a plurality of metal layers separated by interlayer dielectrics to provide the electrical contacts to the 4-leg bridges and the multiplexers,
    B) a step of transferring the array of strain gages to a polyimide film, and
    C) steps of providing electrical controls and data acquisition components separate from the array of semiconductor strain cells.

12. The process of claim 11 wherein the at least two multiplexers are at least two thin film transistors.

13. The process of claim 11 wherein the array of strain gauges are fabricated in micro-crystalline silicon.

14. The process of claim 13 wherein the array is bonded to a flexible substrate.

15. The process of claim 14 wherein the substrate is a polyimide substrate.

16. The process of claim 11 wherein the array is adapted for measuring the structural state of an aircraft part based on strain measurements of portions of the part.

17. The process of claim 11 wherein the array is adapted for providing strain measurements or a surface to provide input information for deformation correction.

18. The process of claim 17 wherein the surface is the surface of an antenna.

19. The process of claim 11 wherein the array is adapted to measure movements of prosthetics.

20. The process of claim 11 wherein the array is adapted to measure movements of parts of robotic equipment.

* * * * *